(12) United States Patent
Farnworth et al.

(10) Patent No.: US 6,362,637 B2
(45) Date of Patent: *Mar. 26, 2002

(54) APPARATUS FOR TESTING SEMICONDUCTOR WAFERS INCLUDING BASE WITH CONTACT MEMBERS AND TERMINAL CONTACTS

(75) Inventors: Warren M. Farnworth, Nampa; Salman Akram, Boise; Alan G. Wood, Boise; David R. Hembree, Boise; James M. Wark, Boise; John O. Jacobson, Boise, all of ID (US)

(73) Assignee: Micron Technology, Inc., Boise ID (*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/241,262

(22) Filed: Feb. 1, 1999

Related U.S. Application Data

(62) Division of application No. 08/770,942, filed on Dec. 31, 1996, now Pat. No. 5,952,840.

(51) Int. Cl.[7] .............................................. G01R 31/02
(52) U.S. Cl. ....................................... 324/755; 324/765
(58) Field of Search ............................... 324/755, 765, 324/754, 158.1; 439/68, 70, 91, 74, 331, 64; 438/14, 17, 18; 257/40, 48

(56) References Cited

U.S. PATENT DOCUMENTS

| 4,968,589 A | 11/1990 | Perry |
| 5,020,219 A | 6/1991 | Leedy ........................ 29/846 |
| 5,034,685 A | 7/1991 | Leedy ..................... 324/158 F |
| 5,090,118 A | 2/1992 | Kwon et al. |
| 5,279,975 A | 1/1994 | Devereaux et al. ............ 437/8 |
| 5,302,891 A | 4/1994 | Wood et al. ............. 324/158 F |
| 5,367,253 A | 11/1994 | Wood et al. |
| 5,408,190 A | 4/1995 | Wood et al. |
| 5,424,652 A | 6/1995 | Hembree et al. ........... 324/765 |
| 5,440,240 A * | 8/1995 | Wood et al. ................ 324/765 |
| 5,440,241 A | 8/1995 | King et al. .................. 324/765 |
| 5,453,701 A | 9/1995 | Jensen et al. ............... 324/755 |
| 5,457,400 A | 10/1995 | Ahmad et al. .............. 324/763 |
| 5,483,741 A | 1/1996 | Akram et al. .................. 29/846 |
| 5,519,332 A | 5/1996 | Wood et al. |
| 5,539,324 A | 7/1996 | Wood et al. ................ 324/758 |
| 5,541,525 A | 7/1996 | Wood et al. |
| 5,559,444 A | 9/1996 | Farnworth et al. .......... 324/754 |
| 5,592,736 A | 1/1997 | Akram et al. ................. 29/842 |
| 5,634,267 A | 6/1997 | Farnworth et al. ............ 29/840 |
| 5,676,301 A | 10/1997 | Gochnour et al. ............ 29/827 |
| 5,691,041 A * | 11/1997 | Frankeny et al. ............. 439/74 |

(List continued on next page.)

FOREIGN PATENT DOCUMENTS

JP   62 293629   12/1987

*Primary Examiner*—Vinh P. Nguyen
(74) *Attorney, Agent, or Firm*—Stephen A. Gratton

(57) ABSTRACT

A method, apparatus and system for testing semiconductor wafers are provided. The method includes providing a wafer carrier to provide an electrical path for receiving and transmitting test signals to the wafer. The wafer carrier includes a base for retaining the wafer, and an interconnect having contact members configured to establish electrical communication with contact locations on the wafer. The wafer carrier can include one or more compressible spring members configured to bias the wafer and interconnect together in the assembled carrier. The wafer carrier can be assembled, with the wafer in alignment with the interconnect, using optical alignment techniques, and an assembly tool similar to aligner bonder tools used for flip chip bonding semiconductor dice. A system for use with the carrier can include a testing apparatus configured to apply test signals through the carrier to the wafer while the wafer is subjected to temperature cycling.

20 Claims, 6 Drawing Sheets

U.S. PATENT DOCUMENTS

| | | |
|---|---|---|
| 5,691,649 A | 11/1997 | Farnworth et al. |
| 5,783,461 A | 7/1998 | Hembree ............... 438/17 |
| 5,796,264 A | 8/1998 | Farnworth et al. |
| 5,801,452 A | 9/1998 | Farnworth et al. ......... 257/797 |
| 5,815,000 A | 9/1998 | Farnworth et al. |
| 5,825,195 A | 10/1998 | Hembree et al. ........... 324/765 |
| 5,834,945 A | 11/1998 | Akram et al. |
| 5,844,418 A | 12/1998 | Wood et al. |
| 5,878,485 A | 3/1999 | Wood et al. |
| 5,896,036 A | 4/1999 | Wood et al. |
| 5,952,840 A | 9/1999 | Farnworth et al. |
| 6,060,891 A | 5/2000 | Hembree et al. |
| 6,060,893 A | 5/2000 | Farnworth et al. |
| 6,064,216 A | 5/2000 | Farnworth et al. |
| 6,077,723 A | 6/2000 | Farnworth et al. |
| 6,091,251 A | 7/2000 | Wood et al. |
| 6,094,058 A | 7/2000 | Hembree et al. |

* cited by examiner

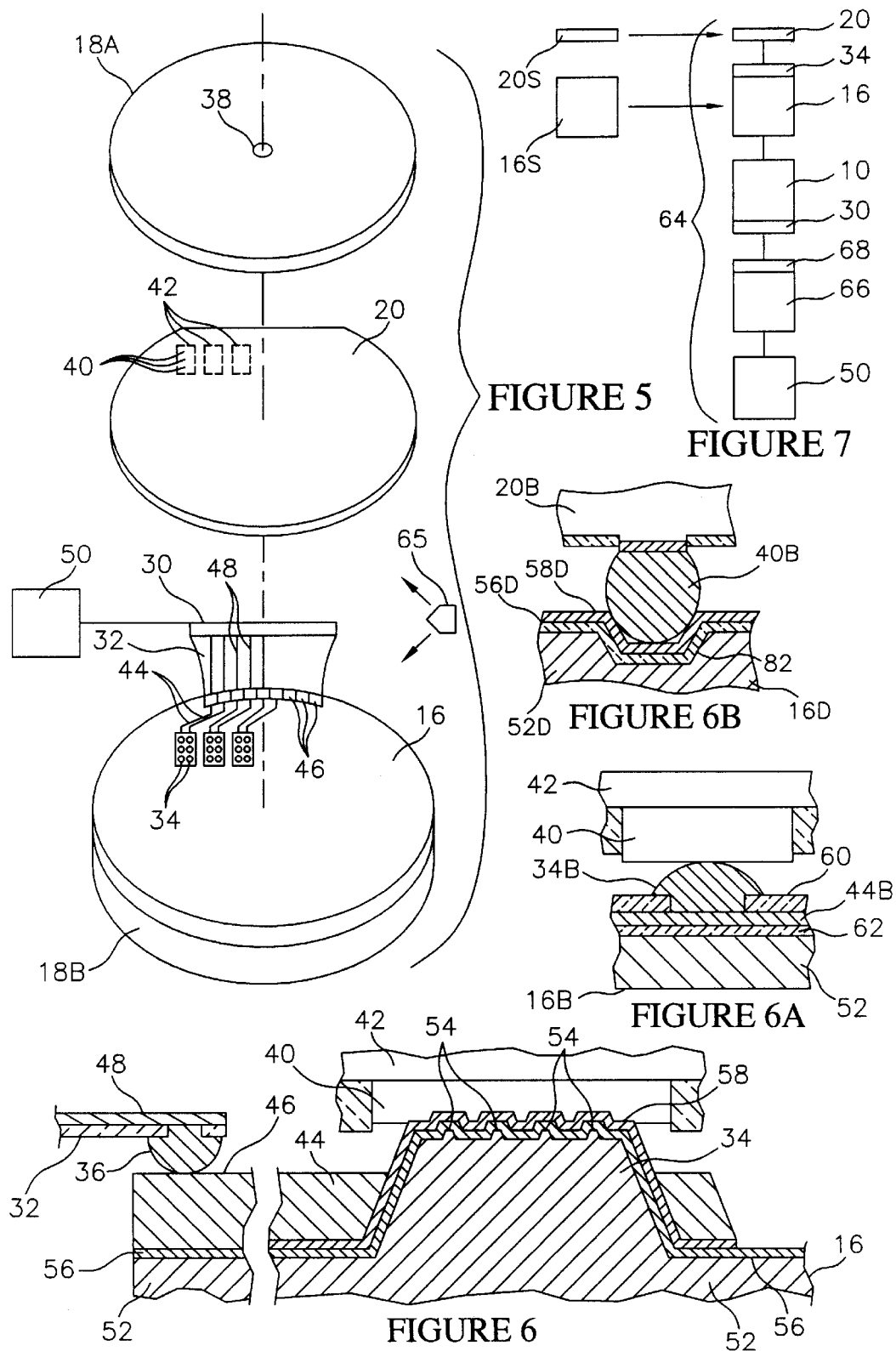

APPARATUS FOR TESTING SEMICONDUCTOR WAFERS INCLUDING BASE WITH CONTACT MEMBERS AND TERMINAL CONTACTS

CROSS REFERENCE TO RELATED APPLICATIONS

This application is a division of application Ser. No. 08/770,942 filed Dec. 31, 1996 (now U.S. Pat. No. 5,952,840).

FIELD OF THE INVENTION

This invention relates generally to semiconductor manufacture and more particularly to a method, apparatus and system for testing semiconductor dice contained on a wafer.

BACKGROUND OF THE INVENTION

Semiconductor dice must be tested during the manufacturing process to insure the reliability and performance characteristics of the integrated circuits on the dice. Accordingly, different testing procedures have been developed by semiconductor manufacturers for testing semiconductor dice. Standard tests for gross functionality are typically performed by probe testing the dice at the wafer level. Probe testing at the wafer level can also be used to rate the speed grades of the dice. Probe testing is typically performed using a probe card and wafer stepper.

Burn-in testing is typically performed after the dice have been singulated from the wafer and individually packaged. During burn-in testing, the packaged dice are subjected to temperature cycling for extended periods of time, while different electrical parameters of the integrated circuits are evaluated. For burn-in testing, a testing apparatus such as a burn-in board and burn-in oven can be used.

It would be advantageous to be able to burn-in test the semiconductor dice at the wafer level prior to singulation and packaging of the dice. Such a wafer level test procedure would be particularly advantageous in the manufacture of unpackaged dice. With unpackaged dice, carriers must be provided to temporarily package the singulated bare dice for testing and certification as known good dice (KGD). By burn-in testing the dice at the wafer level, the expense associated with temporarily packaging the bare dice for burn-in would be eliminated.

SUMMARY OF THE INVENTION

In accordance with the invention, a method, apparatus and system for wafer level testing semiconductor dice are provided. The method includes providing a carrier configured to house a semiconductor wafer and to establish electrical communication between the dice on the wafer and testing circuitry. The carrier, generally stated, comprises: a base and a cover for retaining the wafer; an interconnect for establishing temporary electrical communication with the dice on the wafer; and a force applying member for biasing the wafer against the interconnect. The carrier is operable with a testing apparatus having testing circuitry configured to apply test signals through the interconnect to the integrated circuits on the dice. The testing apparatus can include a chamber for subjecting the wafer to temperature cycling during testing of the integrated circuits. The temperature cycling can be heating for burn-in testing, or in some test procedures, cooling the integrated circuits below ambient (e.g., −25° C. to 125° C.).

In an illustrative embodiment the interconnect is interchangeable with other interconnects to allow testing of different wafer configurations using the same carrier. The interconnect includes contact members configured to electrically connect to contact locations, such as flat or bumped bond pads on the wafer. The interconnect can comprise a silicon substrate with etched contact members, or alternately, a substrate having microbump contact members formed on a tape material, similar to multi layered TAB tape. The interconnect can be mounted to the carrier base with the contact members on the interconnect electrically connected to an electrical connector formed on the base. The electrical connector on the carrier base can be configured for making electrical engagement with a corresponding electrical connector on the testing apparatus. An electrical path between the interconnect and the electrical connector can be with TAB tape, impedance matched TAB tape, wire bonds or mechanical-electrical connectors, such as clips or slides.

The force applying member for the carrier can comprise one or more compressible spring members formed of an elastomeric material. In the illustrative embodiment, a first elastomeric spring member is placed in contact with the wafer and cover, and a second elastomeric spring member is placed in contact with the interconnect and base. The dimensions of the carrier and thicknesses of the elastomeric spring members can be selected such that in the assembled carrier, the wafer and interconnect are biased against one another by forces generated by compression of the elastomeric spring members. Alternately the compressible spring member can comprise a gas filled bladder.

For assembling the carrier with a wafer under test (WUT), optical alignment techniques can be used to align the contact locations on the wafer with the contact members on the interconnect. For example, a split optics alignment device, such as an aligner bonder tool, can be used to align the wafer with the interconnect and to place the wafer and the interconnect in contact. During the alignment and assembly process, the wafer can be secured to the cover by applying a vacuum force through a vacuum opening in the cover. With the wafer and interconnect placed in contact, the cover can be secured to the carrier base with a latching mechanism comprising clips, magnets, threaded fasteners or similar members.

In an alternate embodiment the carrier base comprises a board formed of an insulating material, such as a glass filled resin (e.g., FR-4 board), or a ceramic material. In this alternate embodiment, the interconnect can be placed in electrical communication with conductors and an edge connector formed on the base.

In another alternate embodiment, the base and interconnect can comprise a ceramic substrate with deposited conductors and indentation contact members for bumped dice. Interlevel conductors formed in the ceramic substrate electrically connect the indentation contact members to terminal contacts formed on the base. The terminal contacts can comprise ball contacts arranged in a ball grid array (BGA) for high speed testing of wafers having a large number of contact locations (e.g., 1000 or more). In this embodiment the ceramic substrate can also include an edge connector configured for direct electrical connection to a burn-in board. For testing dice with flat bond pads, the substrate can comprises a photo etchable glass formed with etched contact members and deposited conductors.

A system for testing a semiconductor wafer in accordance with the invention can include the wafer carrier and a testing apparatus in electrical communication with test circuitry. During the test procedure defective dice on the wafer can be identified and discarded during a subsequent wafer singulation process. Optionally, if the wafer has a high enough yield of good dice, the wafer carrier and tested wafer can comprise a permanent multi chip module.

BRIEF DESCRIPTION OF THE DRAWINGS

FIG. 5 is an exploded schematic perspective view illustrating some of the components of the carrier;

FIG. 6 is an enlarged schematic cross sectional view taken along section line 6—6 of FIG. 4 illustrating a contact member on an interconnect for the carrier, in electrical contact with a contact location on the wafer;

FIG. 6A is an enlarged schematic cross sectional view equivalent to FIG. 6 but showing an alternate embodiment interconnect and contact member;

FIG. 6B is an enlarged schematic cross sectional view equivalent to FIG. 6 but showing an alternate embodiment interconnect and contact member for a wafer with bumped dice;

FIG. 7 is a schematic block diagram of a system for testing semiconductor wafers in accordance with the invention;

DETAILED DESCRIPTION OF THE PREFERRED EMBODIMENTS

Figure 4:
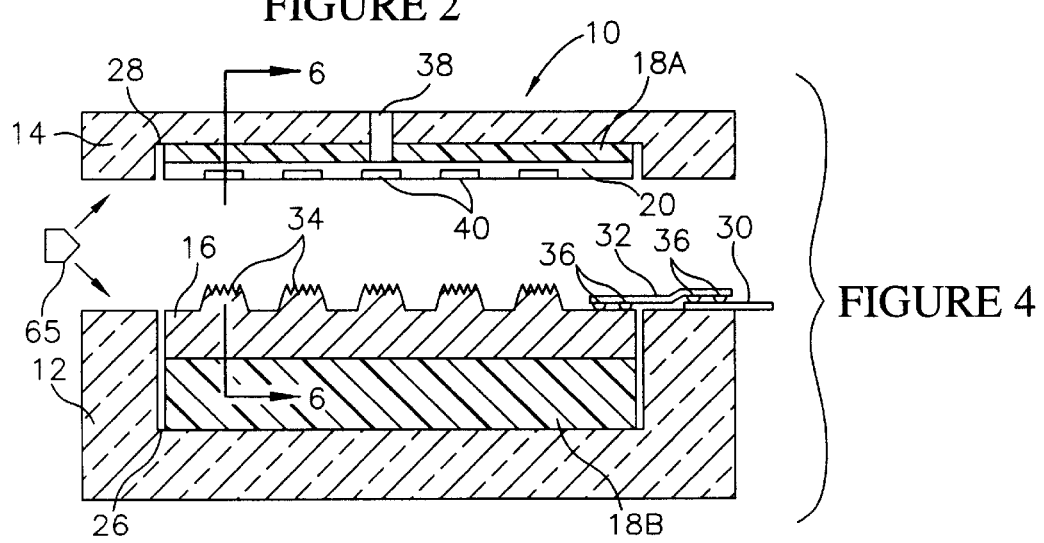
FIG. 4 is a schematic cross sectional view taken along section line 4—4 of FIG. 2 illustrating the assembly of the carrier.

Referring to FIGS. 1–4, a carrier 10 constructed in accordance with the invention is shown and generally stated, comprises: a base 12; a cover 14; an interconnect 16 (FIG. 4); and a force applying member in the form of elastomeric spring members 18A and 18B (FIG. 4). The carrier 10 is adapted to burn-in and test a semiconductor wafer 20.

The base 12 and cover 14 can be formed of an insulating material such as molded plastic or laminated ceramic and are adapted for mating engagement. In addition, the base 12 and cover 14 can be formed in a size that corresponds to the size of the wafer 20 being tested (e.g., 8" OD, 12" OD). A base 12 for an 8 inch OD wafer would have an outside diameter greater than 8 inches. A peripheral shape of the base 12 can be as desired. In the illustrative embodiment, the base 12 and cover 14 have a generally rectangular shaped outer peripheral configuration, although other peripheral configurations would also be acceptable.

Clip members 22 (FIG. 1) can be operably associated with the base 12 to removably secure the cover 14 to the base 12 with the wafer 20 therein. Slots 24 formed in the cover 14 and in the base 12 are configured to receive the clip members 22. The clip members 22 can be removable or can be permanently secured, such as with an adhesive, if it is desired to use the carrier 10 as a permanent multi chip module. In addition, one or more vacuum openings 38 can be formed through the cover 14 and spring member 18A for securing the wafer 20 to the cover 14 during alignment and assembly of the carrier 10.

As shown in FIG. 4, the base 12 can include a cavity 26 configured for mounting the interconnect 16 and elastomeric spring member 18B. In a similar manner, the cover 14 can include a cavity 28 configured for mounting the wafer 20 and elastomeric spring member 18A. The size and peripheral outlines of the cavities 26 and 28 will depend on the size and peripheral outlines of the interconnect 16 and wafer 20 respectively.

The elastomeric spring members 18A and 18B can be formed of a material such as silicone, butyl rubber, or fluorosilicone; in foam, gel, solid or molded configurations. Suitable elastomeric materials include "PORON" available from Rogers or "BISCO" available from a Dow Chemical subsidiary. Elastomeric spring member 18A can have an outline that corresponds to an outline of the wafer 20. Elastomeric spring member 18B can have an outline that corresponds to an outline of the interconnect 16. In general, the interconnect 16 can be slightly larger than the wafer 20 to allow electrical access to the interconnect 16. The wafer 20 can also be shaped by removing non function edges, corners or other portions by sawing or similar method.

The elastomeric spring member 18B can be sized and shaped to correspond to the wafer 20. A representative thickness for the elastomeric spring members 18A and 18B can be from 0.5 mm to 4 mm. If desired, the elastomeric spring members 18A and 18B can be secured to the cover 14 and to the base 12 respectively using an adhesive such as silicone. One suitable adhesive is "ZYMET" silicone elastomer manufactured by Zymet, Inc., East Hanover, N.J. The elastomeric spring member 18B can also be attached to the interconnect 16 using the same adhesive.

Rather than being formed of elastomeric materials, a force applying member equivalent to the elastomeric spring members 18A, 18B can be formed as a compressible gas filled bladder. This type of bladder is available from Paratech of Frankfort, Ill. under the trademark "MAXI FORCE AIR BAG". The force applying member can also be formed as a metal or plastic spring member such as a wave spring, leaf spring, bellview washer or compression spring. In addition, the force applying member can include a rigid pressure plate (not shown) between spring member 18A and the wafer 20 or between spring member 18B and the interconnect 16. The pressure plate can be configured to contact the elastomeric spring members 18A or 18B to evenly distribute compressive forces.

The base 12 can also include an electrical connector 30. The electrical connector 30 comprises a male or female connector adapted for mating electrical engagement with a corresponding connector formed on a testing apparatus. As will be further explained, an electrical path can be formed between the interconnect 16 and the electrical connector 30 by a length of TAB (tape automated bonding) tape 32. TAB tape is commercially available from Nitto Denko under the trademark "ASMAT". One type of TAB tape comprises a layer of polyimide having a desired pattern of metal conductors formed thereon. The conductors can include metal bumps 36 formed in vias through the polyimide and arranged in a desired pattern. The metal bumps 36 on the TAB tape 32 can be bonded, using heat or ultrasound, to corresponding connection points on the interconnect 16 and on the electrical connector 30 to form an electrical connection therebetween. Alternately this electrical connection can be formed by wire bonding or mechanical electrical connectors such as electrical clips or slide connectors operably associated with the carrier base 12 and interconnect 16.

As shown schematically in FIG. 4, the interconnect 16 includes a pattern of contact members 34. The contact members 34 are adapted to electrically connect to contact locations 40 on the wafer 20. Typically these contact locations 40 will be the bond pads on the dice 42 (FIG. 5) contained on the wafer 20. However, it is to be understood that the contact locations 40 can be dedicated test pads or other locations on the wafer 20. In general, the interconnect 16 will be customized with a particular pattern of contact members to allow testing a particular type of wafer 20. However, the carrier is designed such that the interconnect 16 can be removed and replaced with another interconnect 16S (FIG. 7) for testing a different wafer 20S (FIG. 7). In this case, the second interconnect can be substantially similar to interconnect 16 but formed with different patterns of contact members 34. Different interconnects can also be interchangeable for testing different contact points on the same wafer.

With the interconnect 16 mounted to the base 12 (FIG. 4), the contact members 34 on the interconnect 16 can be placed in electrical communication with the TAB tape 32 and electrical connector 30 on the carrier 10. As previously stated, the electrical connector 30 is configured for mating electrical engagement with a corresponding connector on a testing apparatus such as a burn-in board. This electrical path is shown schematically in FIGS. 5 and 6.

As shown in FIG. 5, the interconnect 16 can include a plurality of patterns of contact members 34. The locations of the contact members 34 correspond to the locations of the contact locations 40 on the wafer 20. The contact members 34 are adapted to electrically engage the contact locations 40 on the wafer 20 to establish a temporary electrical path for testing. The contact members 34 may be only about 1 μm to 100 μm in height, 50 to 100 μm in width, and 50 to 100 μm apart. As is apparent, the size of the contact members 34 in FIGS. 4 and 5 is greatly exaggerated.

As shown in FIG. 5, the contact members 34 can be formed in electrical communication with patterns of conductors 44 formed on the interconnect 16. The conductors 44 can include contact pads 46 that can be bonded to the metal bumps 36 (FIG. 4) on the TAB tape 32. The TAB tape 32 can also include conductors 48 (FIG. 5) in electrical communication with the contact pads 46 on the interconnect 16 and corresponding connection points (not shown) on the electrical connector 30. The electrical connector 30 can be configured for electrical communication with testing circuitry 50 associated with a testing apparatus. The testing circuitry 50 can be configured to apply test signals through the interconnect 16 to the integrated circuits formed on the dice 42.

Referring to FIG. 6, further details of the interconnect 16, particularly the construction of the contact members 34 are illustrated. The interconnect 16 can include a substrate 52 formed of silicon, ceramic or other etchable material. The contact members 34 can include penetrating projections 54 such as elongated blades adapted to penetrate the contact locations 40 on the wafer 20, to a self limiting penetration depth. The contact members 34 and penetrating projections 54 can be formed by etching the substrate 52.

Following etching of the contact members 34 and penetrating projections 54, an insulating layer 56 can be formed over the entire substrate 52. In addition, a conductive layer 58 can be formed on each contact member 34. The conductive layers 58 for the contact members 34 are in electrical communication with the conductors 44 formed on the interconnect 16. To form an electrical path to the contact members 34, the contact pads 46 for the conductors 44 can be bonded to the metal bumps 36 on the TAB tape 32. Alternately, in place of bonded TAB tape 32 an electrical path can be formed to the contact members 34 with non-bonded mechanical electrical contacts such as clips or slide contacts. As will be further described, wire bonds can also be utilized to provide an electrical path to the contact members 34. A solder reflow can also be utilized.

A suitable process for forming the interconnect 16 and contact members 34 substantially as shown in FIG. 6 is disclosed in U.S. Pat. No. 5,326,428 and U.S. Pat. No. 5,483,741 which are incorporated herein by reference. As will be further explained, the contact members can also be formed on a photosensitive glass or glass-ceramic substrate.

Referring to FIG. 6A, an alternate embodiment interconnect 16B can be formed with microbump contact members 34B and conductors 44B formed on a polyimide film 60. The microbump contact members 34B and polyimide film 60 can be similar to the TAB tape 32 previously described. The polyimide film 60 can be mounted to an interconnect substrate 52B using a compliant adhesive layer 62. The compliant adhesive layer 62 can be formed of a silicone elastomer, an epoxy or a polyimide material. One method for forming an interconnect with microbump contact members is described in U.S. Pat. No. 5,678,301, incorporated herein by reference.

Referring to FIG. 6B, another alternate embodiment interconnect 16D can be configured to make electrical contact with a wafer 20B having bumped contact locations 40B. The bumped contact locations 40B will typically be solder "bumps" for bumped dice. The interconnect 16D can include a substrate 52D formed with indentation contact members 82 for receiving the bumped contact locations 40B. In addition, an insulating layer 56D and a conductive layer 58D can be formed on the substrate 52D. The conductive layer 58D establishes electrical communication with the raised contact locations 40B and is in electrical communication with conductors 48 (FIG. 5) as previously described. The indentation contact members 82 can also include penetrating projections 54 (FIG. 6) for penetrating the bumped contact location 40B as previously described. U.S. Pat. No. 5,592,736, incorporated herein by reference, discloses a method for forming an interconnect for bumped semiconductor dice comprising penetrating projections on a substrate. As will be further explained, indentation contact members can also be formed on a ceramic substrate or photosensitive glass substrate.

Figure 6C:
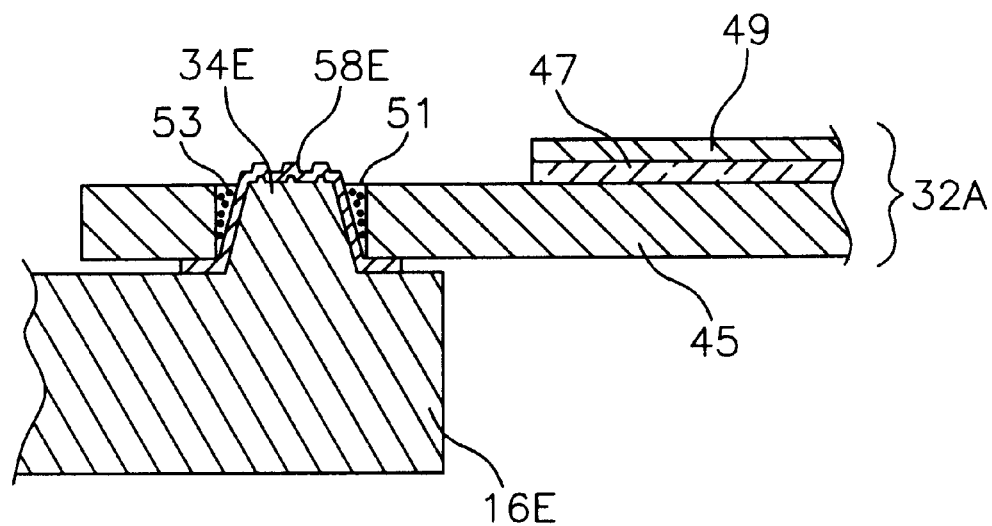
FIG. 6C is an enlarged schematic cross sectional view illustrating an alternate embodiment interconnect having impedance matched conductors.

Referring to FIG. 6C, another alternate embodiment interconnect 16E includes patterns of contact members 34E and an insulating layer (not shown) formed substantially as previously described for contact members 34 (FIG. 6) and insulating layer 56 (FIG. 6). However, in this embodiment the conductors 44 (FIG. 6) can be omitted and an electrical path can be provided between the contact members 34E and the electrical connector 30 (FIG. 5) by an impedance matched tape 32A. The impedance matched tape 32A can be similar to impedance matched TAB tape wherein cross talk between conductive traces on the TAB tape can be minimized by placing a ground plane closer to the traces than the trace to trace separation distance.

The impedance matched tape 32A includes a trace layer 45, a dielectric layer 47, and a ground layer 49. The trace layer 45 is patterned to form a required pattern of conductive traces (not shown). The ground layer 49 provides a ground plane for reducing cross talk between the conductive traces. The trace layer 45 and ground layer 49 can be formed of a metal such as copper foil having a desired thickness (e.g., 1 mil or less). The dielectric layer 47 can be formed of a tape such as a "KAPTON" tape manufactured by Dupont or a deposited film such as polyimide.

The trace layer 45 of the impedance matched tape 32A can include vias 51 formed in the conductive traces in alignment with the contact members 34E. The vias 51 can be etched or otherwise formed in the trace layer 45 in a required pattern. A conductive adhesive material 53 can be deposited in the vias 51 to electrically connect the conductive layers 58E for the contact members 34E to the conductive traces formed in the trace layer 45. The trace layer 45 can be etched or otherwise patterned to form conductive traces for providing desired conductive paths from the contact members 34E to the electrical connector 30 (FIG. 5). In addition, the trace layer 45 can be formed with a thickness that is less than a height of the contact members 34E such that the penetrating projections on the contact members 34E are exposed for contacting the contact locations 40 (FIG. 6) on the dice 42.

Figure 6D:
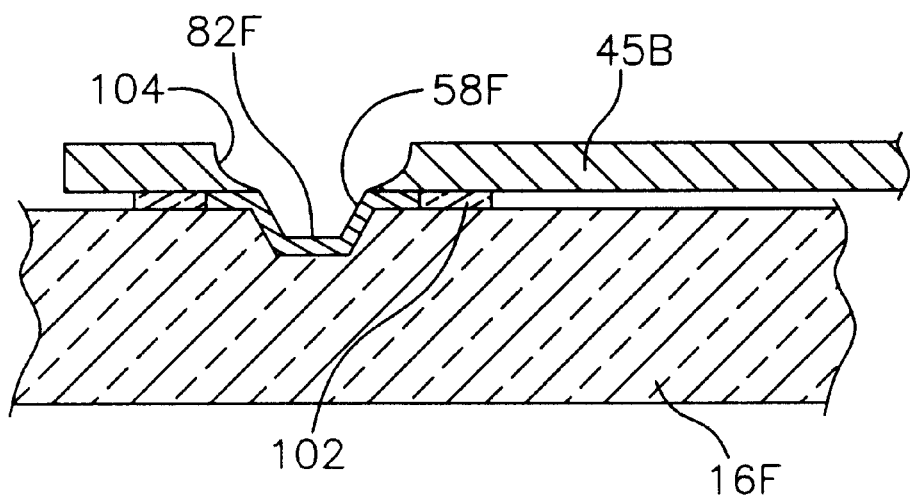
FIG. 6D is an enlarged schematic cross sectional view illustrating an alternate embodiment interconnect for bumped dice.

Referring to FIG. 6D, another alternate embodiment interconnect 16F includes patterns of indentation contact members 82F formed substantially as previously described for indentation contact members 82 (FIG. 6B). The indentation contact members 82F are formed in desired patterns for contacting bumped contact locations 40B (FIG. 6B) on the bumped wafer 20B (FIG. 6B). The indentation contact members 82F include conductive layers 58F in electrical communication with conductive traces (not shown) formed on the trace layer 45B. An insulating layer (not shown) equivalent to insulating layer 56D (FIG. 6B) electrically insulates the conductive layers 58F from the bulk substrate.

The trace layer 45B can be formed of a metal such as copper foil having a desired thickness. An adhesive 102 can be used to secure the trace layer 45B to the interconnect 16F. The trace layer 45B functions substantially as previously described for trace layer 45 (FIG. 6C) to provide separate conductive paths from the indentation contact members 82F to the electrical connector 30 (FIG. 5). In addition, the trace layer 45B can include depressions 104 that align with the indentation contact members 82F. The depressions 104 can be etched or otherwise formed in the trace layer 45B and are sized to retain the bumped contact locations 40B (FIG. 6B). In the illustrative embodiment the depressions are generally concave as would occur with an isotropic etch.

Referring again to FIG. 5, the carrier 10 can be assembled with the front side (circuit side) of the wafer 20 facing and aligned with the interconnect 16. Assembly and alignment can be performed using a modified aligner bonder tool similar to tools used for flip chip bonding semiconductor dice. Flip chip bonding refers to a process wherein a semiconductor die is placed face down on a substrate, such as a printed circuit board, and the bond pads on the die are bonded to connection points on the substrate. Tools for flip chip bonding are sometimes referred to as aligner bonders. An aligner bonder and method of optical alignment for flip chip bonding are described in U.S. Pat. No. 4,899,921 to Bendat et al, entitled "Aligner Bonder". Such an aligner bonder is available from Research Devices of Piscataway, N.J. In addition, U.S. Pat. No. 5,634,267 incorporated herein by reference, describes an automated apparatus suitable for optically aligning the wafer 20 and interconnect 16.

In the present case, an aligner bonder can be modified to provide an assembly apparatus for use in assembling and aligning the carrier 10. The assembly apparatus can include an assembly tool (not shown) adapted to manipulate the cover 14 (FIG. 4) in the x, y and z directions and in different rotational and angular directions. The assembly apparatus can also include means for directing a vacuum through vacuum opening 38 in the cover 14 to retain the wafer 20 on the cover 14 for alignment and assembly. In a similar manner, the assembly apparatus can include a platform (not shown) configured to retain and manipulate the base 12 (FIG. 4) with the interconnect 16 held therein. A split optics viewing device 65 (FIG. 5) of the assembly apparatus can be configured to view the surfaces of the wafer 20 and interconnect 16 and to provide input for moving the wafer 20 or interconnect 16 to align the contact locations 40 on the wafer 20 with the contact members 34 on the interconnect 16. Following alignment, the wafer 20 and interconnect 16 can be brought into contact and the clips 22 (FIG. 1) placed in the slots 24 (FIG. 1) to secure the cover 14 to the base 12.

In the assembled carrier 10, compression of the elastomeric spring members 18A, 18B biases the wafer 20 and interconnect 16 together so that an electrical connection is maintained between the contact members 34 on the interconnect 16 and the contact locations 40 on the wafer 20. The dimensions of the carrier 10 and elastomeric spring members 18A, 18B can be selected such that in the assembled carrier 10 the elastomeric spring members 18A, 18B are compressed to exert a desired biasing force on the wafer 20 and interconnect 16. By way of example, the elastomeric spring members 18A, 18B can be dimensioned to compress from 10% to 90% of their uncompressed thickness.

Referring to FIG. 7, a schematic diagram of a system 64 for testing the wafer 20 in accordance with the invention is shown. The system 64 includes the interconnect 20 having contact members 34 formed as previously described. In addition, the interconnect 16 is mounted within the carrier 10 as previously described. The system 64 also includes a testing apparatus 66 having an electrical connector 68 configured to electrically connect to the electrical connector 30 on the carrier 10. For example, the testing apparatus 66 can include a burn-in board and temperature chamber. The burn-in board can be configured to mount one or more carriers 10 for testing. The temperature chamber can be configured to subject the wafer 20 and carrier 10 to temperature cycling (e.g., −25° C. to 125° C.) for desired periods of time (e.g., from seconds to hours). In addition, the electrical connector 68 can be contained within the temperature chamber in electrical communication with the testing circuitry 50. The testing circuitry 50 can be configured to apply test signals to the integrated circuits contained on the dice 42 while the circuits are temperature cycled.

As previously mentioned, some testing procedures will necessitate cooling rather than heating the wafer 20. For example, some test procedures are capable of generating about 30 watts per device contained on the wafer 20. Accordingly, the wafer 20, or testing apparatus 66, or both, can be configured to remove heat from the wafer 20. In this case, the carrier 10 can include cooling fins or alternately a built in heat exchanger. In addition, the testing apparatus 66 can include a cooling chamber configured to circulate a cooling medium such as air around the carrier 10.

As also shown in FIG. 7, the same system 64 and carrier 10 can be used to test a second semiconductor wafer 20S. In this case, the interconnect 16 can be removed from the carrier 10 and replaced with a second interconnect 16S configured to electrically connect to the second wafer 20S. Alignment and assembly of the second wafer 20S in the carrier 10 can be as previously described. Alternately, the second interconnect 16S can be used to test different contact locations on the original wafer 20.

Figure 8:
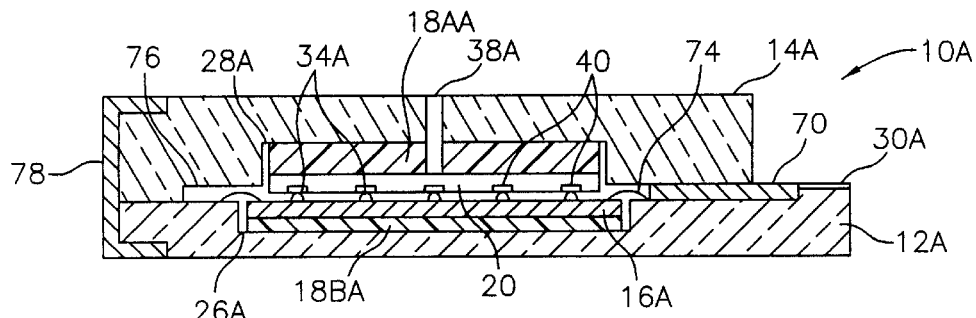
FIG. 8 is a schematic cross sectional view of an alternate embodiment carrier.
Figure 9:
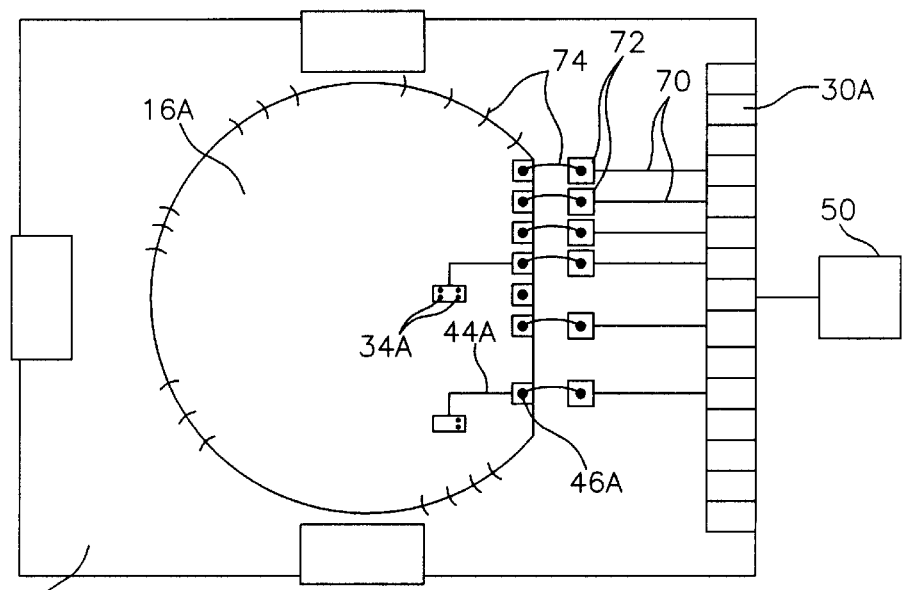
FIG. 9 is a schematic plan view with parts removed of a carrier base for the alternate embodiment carrier.

Referring to FIGS. 8 and 9, an alternate embodiment carrier 10A is illustrated. The carrier 10A includes a base 12A; a cover 14A; and an interconnect 16A. These components function substantially similar to the equivalent components for the carrier 10 previously described for interconnect 16. The interconnect 16A is formed substantially as previously described for interconnect 16. The carrier 10A also includes elastomeric spring members 18AA, 18BA formed substantially as previously described. In FIG. 9, the carrier base 12A is illustrated with the cover 14A not shown.

One aspect of the alternate embodiment carrier 10A is that the carrier base 12A can be formed of a circuit board material such as FR-4 or other insulating material such as a glass filled plastic or laminated ceramic. A pattern of conductors 70 can be formed on the base 12A using a suitable formation process such as screen printing or metallization (e.g., deposition, patterning, etching). The conductors 70 can include bonding pads 72. In addition, an electrical connector 30A can be formed on the base 14A in electrical communication with the conductors 70. The electrical connector 30A functions substantially as previously described for connector 30.

The carrier base 12A can also include a cavity 26A (FIG. 8) wherein the interconnect 16A and elastomeric spring member 18BA can be mounted using an adhesive as previously described. The interconnect 16A includes contact members 34A, conductors 44A and contact pads 46A as previously described. An electrical path can be established between the contact pads 46A on the interconnect 16A and the bonding pads 72 on the carrier base 12A by bond wires 74. In this case the contact pads 46A and bonding pads 72 can be formed with a wire bondable metallurgy. Accordingly a conventional wire bonding process can be used to wire bond the bond wires 74 to the contact pads 46A on the interconnect 16A and to the bonding pads 72 on the carrier base 12A. In place of wire bonds, this electrical path can also be formed by TAB tape or mechanical-electrical connectors as previously described.

As shown in FIG. 8, the cover 14A for the carrier 10A can include a cavity 28A wherein the elastomeric spring member 18AB can be mounted, such as with a silicone adhesive as previously described. The cover 14A can also include a wire bond cavity 76 (FIG. 8) sized and located such that the cover 14A does not interfere with the bond wires 74. The cover 14A can be secured to the carrier base 12A with one or more clips 78 operably associated with the cover 14A and base 12A as previously described for clips 22 and carrier 10. The cover 14A can also include a vacuum opening 38A to permit retention of the wafer 20 during alignment and assembly of the carrier 10A. The carrier 10A can be assembled with the contact members 34A on the interconnect 16A in alignment with the contact locations 40 on the wafer 20 using optical alignment techniques substantially as previously described. The carrier 10A functions substantially as previously described for placement in a testing apparatus 66 (FIG. 7) to permit testing of the integrated circuits formed on the dice 42 contained on the wafer 20.

Figures 10, 10A:
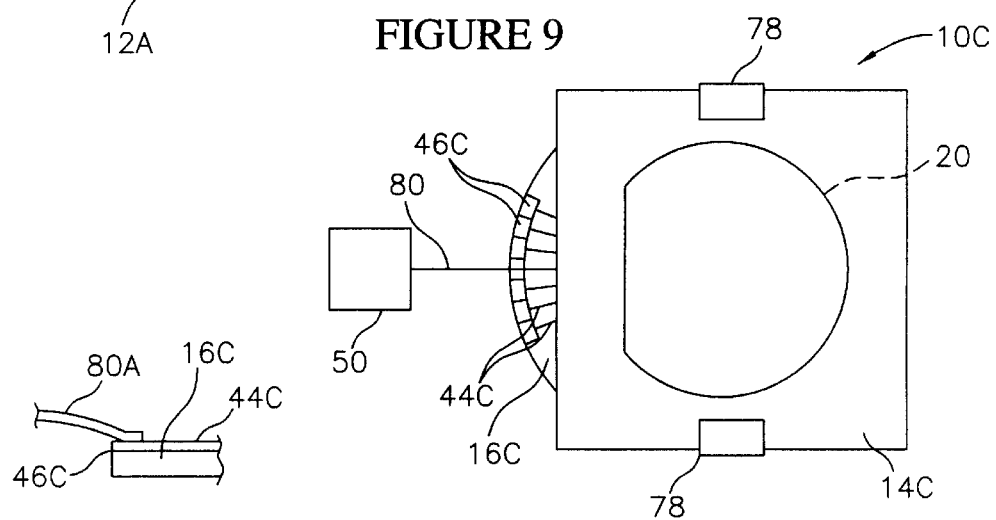
FIG. 10 is a schematic plan view of another alternate embodiment carrier wherein an interconnect of the carrier is configured for direct electrical connection to testing circuitry.
FIG. 10A is a schematic side view illustrating an exemplary electrical connection between testing circuitry and the carrier of FIG. 10.

Referring to FIG. 10, another alternate embodiment carrier 10C is illustrated. In this embodiment the cover 14C and interconnect 16C are constructed to allow direct electrical access to the contact pads 46C on the interconnect 16C. An electrical path 80 from the testing circuitry 50 to the contact pads 46C and conductors 44C on the interconnect 16C can comprise mechanical electrical connectors such as clips or slide connectors. By way of example, FIG. 10A illustrates an electrical clip 80A configured to make a direct electrical connection to the contact pads 46C on the interconnect 16C.

Figure 1:
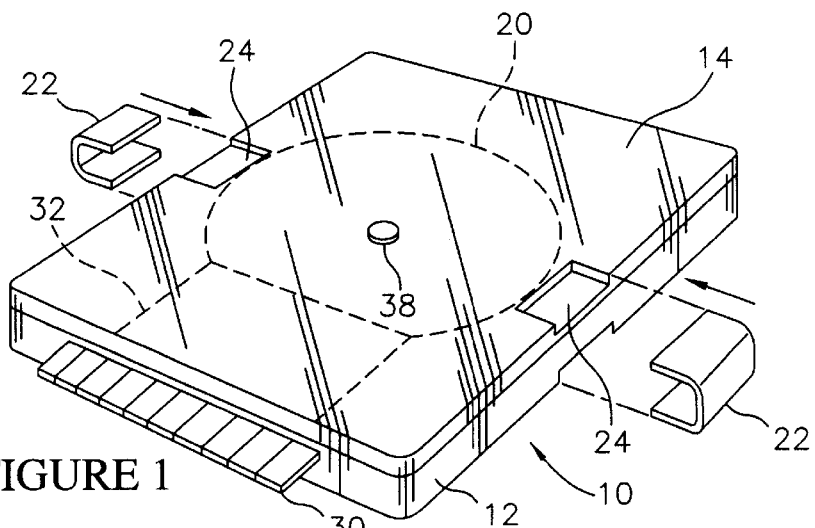
FIG. 1 is a perspective view of a carrier constructed in accordance with the invention for testing a semiconductor wafer.
Figure 2:
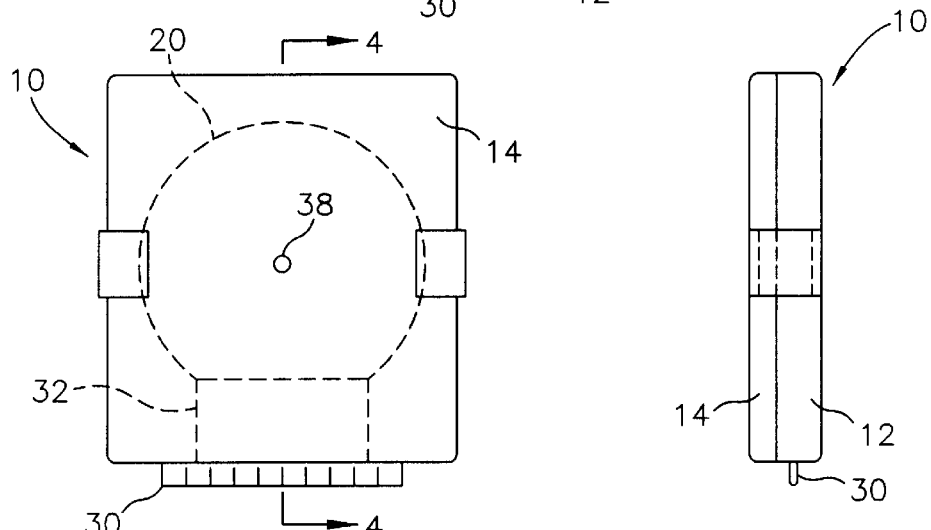
FIG. 2 is a plan view of the carrier.
Figure 3:
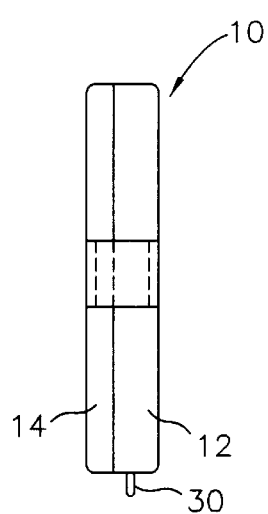
FIG. 3 is a side elevation view of the carrier.

Referring to FIGS. 11–14, an alternate embodiment carrier can include a carrier base 12B formed of ceramic. The carrier base 12B performs the function of both the base 12 (FIG. 1) and the interconnect 16 (FIG. 4) for the previously described carrier 10 (FIG. 1). The carrier base 12B includes indentation contact members 82A for making electrical contact with bumped contact locations 40B on bumped wafer 20B. In addition, the carrier base 12B includes terminal contacts 92 for making electrical connection to testing circuitry 50 (FIG. 7). The terminal contacts 92 are particularly adapted for performing some types of tests such as high speed testing. The carrier base 12B also includes a female electrical connector 30F (FIG. 13) for making electrical connection to the testing circuitry 50 (FIG. 7). The female electrical connector 30F is particularly adapted for performing some types of tests such as burn-in testing wherein the connector 30F mates with a corresponding connector on a burn-in board.

The indentation contact members 82A comprise concave depressions formed on an upper active surface of the base 12B and covered with a conductive layer 58I. In this case an insulating layer is not required under the conductive layer 58I because the carrier base 12B is formed of electrically insulating ceramic. The indentation contact members 82A can be formed by laser drilling, punching, etching or similarly forming, depressions in the ceramic carrier base 12B. The conductive layer 58I can then be formed in the depressions using a deposition or metallization process. The sizes of the depressions corresponds to the sizes of the bumped contact locations 40B. Conventionally formed solder bumps on a bumped die will have a diameter of from 5 mil to 30 mil. Accordingly, the indentation contact members 82A can be formed in this size range.

The carrier base 12B can be formed as a multi layered structure using a ceramic lamination process. In a representative process, green sheets of unsintered raw ceramic are cut to size and via holes and inside features are formed as required. Some of the layers of ceramic can include metallization patterns as required. The green sheets are then sintered at elevated temperatures in a reducing atmosphere to form a unitary structure. As shown schematically in FIG. 11, metal filled vias 90 can be formed in the carrier base 12B to provide electrical interconnection between the conductive layers 82A for the indentation contact members 82A and the terminal contacts 92 for the carrier base 12B.

In addition to being in electrical communication with the metal filled vias 90 and terminal contacts 92, the conductive layers 58I for the indentation contact members 82A can be in electrical communication with multi level conductors 44ML (FIG. 12) formed on the carrier base 12B. The multi level conductors 44ML are configured to provide electrical connection to dense arrays of indentation contact members 82A. Such an arrangement may be required for testing dense arrays of bumped contact locations 40B (e.g., over 1000 I/O).

Figure 12:
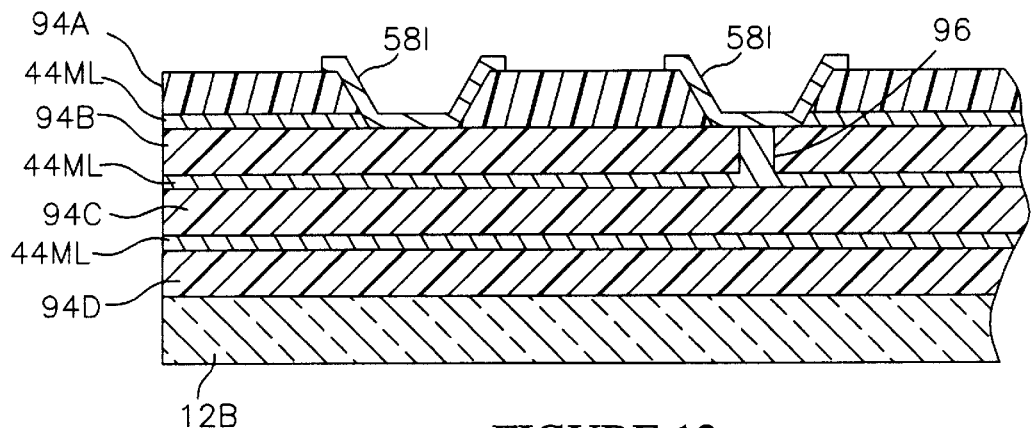
FIG. 12 is a schematic cross sectional view of the ceramic base shown in FIG. 11 showing interlevel conductors.

As shown in FIG. 12, the multi level conductors 44ML are electrically insulated from one another and from the outside world by insulating layers 94A–94D formed on the carrier base 12B. The insulating layers 94 not only provide electrical insulation between the multi level conductors 44ML but also help to prevent cross talk and capacitive coupling therebetween.

The multi level conductors 44ML can be formed using a metallization process in which metal layers are blanket deposited (e.g., CVD), patterned (e.g., photopatterned with resist) and then etched. As used herein, the term "multi level conductors" means that the conductors 44ML are not coplanar to one another but are on different planes. Typically, these different planes are horizontal to one another and to the plane of the planar active surfaces of the carrier base 12B.

The multi level conductors 44ML are preferably formed of a highly conductive metal such as aluminum. A representative thickness for the multi level conductors 44ML can be from 500 to 3000 Å. The insulating layers 94A–94D can be formed of an electrically insulating material, such as polyimide, using a suitable deposition process (e.g., spin-on). Other deposited materials such as $Si_3N_4$ would also be suitable. Depending on the material and deposition process, a thickness of each insulating layer 94A–94D can be from 500 Å to 2 $\mu$m or more. Conductive vias 96 can be formed in the insulating layers 94A–94D to interconnect the multi level conductors 44ML to the conductive layers 58I as required. The conductive vias 96 can be formed by etching or lasering vias in the insulating layers 94A–94D and filling the vias with metal. In addition, the multi level conductors 44ML can be formed in electrical communication with the metal filled vias 90 (FIG. 11) and the terminal contacts 92 as required.

The terminal contacts 92 can be formed on a lower active surface of the carrier base 12B. One method for forming the terminal contacts 92 is by screen printing a solder paste onto land pads 100 formed in a desired pattern on the lower active surface of the carrier base 12B. The land pads 100 can be formed in electrical communication with the metal filled vias 90 as required. The land pads 100 can be formed out of suitable metal or stack of metals. Exemplary metals can include gold, copper, silver, tungsten, tantalum, platinum, palladium and molybdenum or alloys of these metals. A metallization process such as plating can be used to form the land pads 100. Such a plating process can include electrolytic or electroless deposition of a metal layer followed by resist coating, exposure, development, and selective wet chemical etching.

The terminal contacts 92 can be formed on the land pads 100 as metal ball contacts arranged in a dense grid pattern such as a ball grid array (BGA). The terminal contacts 92 can be configured for contact with a mating electrical connector such as a socket of a burn-in board in electrical communication with external test circuitry. One method for forming the terminal contacts 92 is by screen printing a solder paste onto the land pads 100 followed by reflow into a spherical shape. U.S. Ser. No. 08/584,628, incorporated herein by reference, discloses a method for forming land pads and terminal contacts on a temporary package for semiconductor dice.

The terminal contacts 92 can also be formed of a relatively hard metal such as nickel, copper, beryllium copper, or an alloy such as "KOVAR" and "ALLOY 42". In this case the terminal contacts 92 can be formed separately and then attached to the land pads 100 by soldering, brazing, welding or applying a conductive adhesive. U.S. Pat. No. 5,783,461, incorporated herein by reference, describes one method for forming hard metal terminal contacts on a temporary package.

Figures 13, 14:
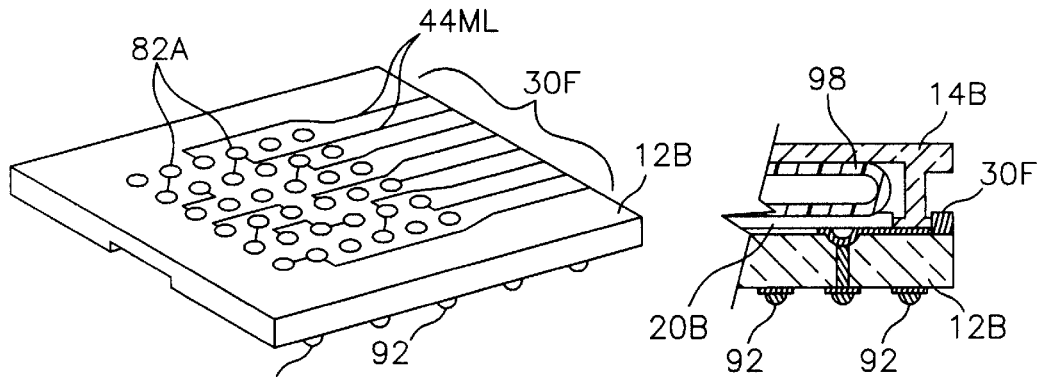
FIG. 13 is a schematic perspective view of the ceramic base shown in FIG. 11.
FIG. 14 is a schematic cross sectional view of the ceramic base of FIG. 11 and a force applying member operably associated with the ceramic base.

As shown schematically in FIG. 14, a cover 14B can be operatively associated with the carrier base 12B substantially as previously described for cover 14A (FIG. 8). In this case the female edge connector 30F can be recessed with respect to the cover 14B for added protection. In addition, the force applying mechanism for pressing the wafer 20B against the carrier base 12B can comprise a gas filled bladder 98 as previously described.

Figure 11:
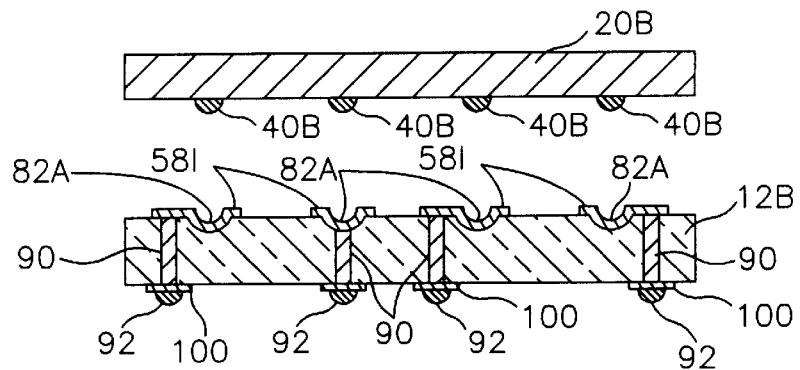
FIG. 11 is a schematic cross sectional view of an alternate embodiment carrier having a ceramic base with interlevel conductors and indentation contact members for bumped dice.
Figure 15:
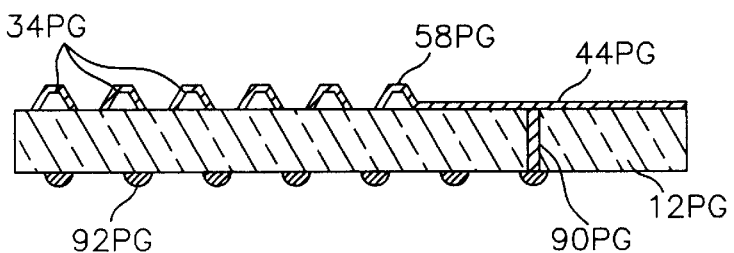
FIG. 15 is a schematic cross sectional view of an alternate embodiment photosensitive glass substrate equivalent to the ceramic substrate of FIG. 13 but formed with contact members for testing dice with flat bond pads.

Referring to FIG. 15, an alternate embodiment carrier base 12PG can be formed of photosensitive glass-ceramic material that is etchable using a photo machining process. The carrier base 12PG functions substantially the same as carrier base 12B previously described, but includes raised contact members 34PG rather than indentation contact members 82A (FIG. 11). The raised contact members 34PG are adapted for testing wafers 20 with flat contact locations 40 (FIG. 6). The raised contact members 34PG can be formed substantially similarly to the contact members 34 (FIG. 6) previously described. However, in this case rather than etching a silicon substrate 52 (FIG. 6) the substrate can be formed of a photosensitive glass or glass-ceramic material such as "FOTOFORM" manufactured by Corning.

An exemplary process can include exposing a desired pattern of contact members 34PG, developing an image by heating, flooding exposed areas with uncollimated UV, etching (e.g., HF), and then heating to convert glass to glass ceramic. Following the formation process the contact members 34PG can be covered with conductive layers 58PG formed in electrical communication with conductors 44PG which can be multi level as previously described. The conductive layers 58PG and conductors 58PG function substantially the same as the equivalent elements previously described.

In addition, the carrier base 12PG can include metal filled vias 90PG in electrical communication with terminal contacts 92PG. Again these elements functions the same as the equivalent elements previously described. The metal filled vias 92PG can be formed using photo machining and deposition processes. The terminal contacts 92PG can be formed as previously described of a solder or hard metal.

Figure 16:
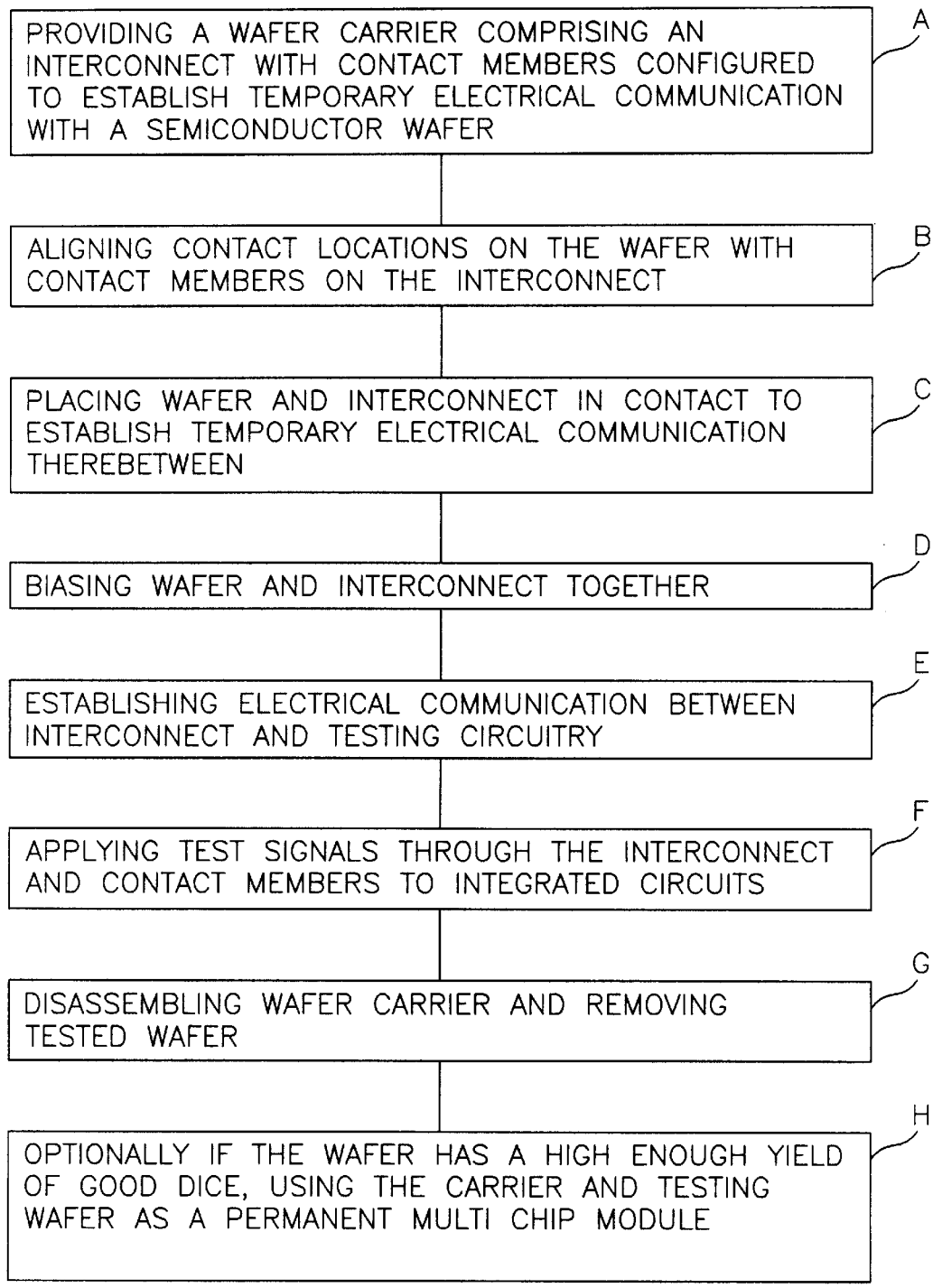
FIG. 16 is a block diagram of steps involved in the testing a wafer in accordance with the invention.

Referring to FIG. 16, steps in a method for testing a semiconductor wafer in accordance with the invention are illustrated. Initially a wafer carrier is provided comprising an interconnect with contact members configured to establish temporary electrical communication with the wafer, step A. The wafer carrier can be configured to retain the wafer for testing and burn-in as previously described for carriers 10, 10A or 10C. The interconnect can be constructed as previously described for interconnects 16, 16A, 16B, 16C and 16D. Alternately, the wafer carrier can be formed with a base 12B that includes integrally formed contact members (82A or 34PG).

Next, contact locations on the wafer (e.g., flat or bumped bond pads) are aligned with the contact members on the interconnect, step B. This can be accomplished using optical alignment techniques as previously described.

Next, the interconnect and wafer are placed in contact to establish temporary electrical communication therebetween, step C. This can be accomplished using an aligner bonder tool as previously described to align and assemble the carrier.

Next, the interconnect and wafer are biased together to maintain contact and temporary electrical communication, step D. This can be accomplished using a compressible spring member such as elastomeric springs 18A, 18B (FIG. 4) or gas filled bladder 98 (FIG. 14).

Next, electrical communication is established between the interconnect (or base 12B) and testing circuitry, step E. This can be accomplished by providing the carrier with an electrical connector, forming an electrical path from the contact members on the interconnect to the electrical connector, and then placing the carrier in a testing apparatus (e.g., burn-in oven) with a mating electrical connector. Alternately a direct electrical path from testing circuitry through an edge connector (e.g., 34—FIG. 13) on the interconnect or base can be formed.

Next, test signals are applied through the interconnect and contact members to the integrated circuits on the wafer, step F. The test signals can be applied with the carrier placed in a chamber with temperature cycling capabilities, such as a burn-in oven, to provide burn-in testing or a cooling chamber to dissipate heat for high speed testing.

Next, the carrier is disassembled and the tested wafer is removed, step G.

Optionally, if the wafer has a high enough yield of good dice, the carrier and tested wafer can be used as a permanent multi chip module, step H. In this case, electrical communication can be established between the tested wafer and the outside world, by the interconnect, edge connectors and terminal contacts on the carrier base.

Thus the invention provides an improved method, apparatus and system for testing semiconductor wafers. While the invention has been described with reference to certain preferred embodiments, as will be apparent to those skilled in the art, certain changes and modifications can be made without departing from the scope of the invention as defined by the following claims.

What is claimed is:

1. An apparatus for testing a semiconductor wafer having a plurality of bumped contact locations comprising:
   a base configured to retain the wafer, the base comprising a first surface and an opposing second surface;
   a plurality of contact members on the first surface comprising metallized indentations configured to electrically engage the bumped contact locations;
   a plurality of terminal contacts onthe second surface in electrical communication with the contact members configured to electrically connect the contact members to a testing circuit; and
   an electrical connector on the base in electrical communication with the contact members and configured to electrically connect the contact members to the testing circuit.

2. The apparatus of claim 1 wherein the base comprises a ceramic.

3. The apparatus of claim 1 wherein the base comprises a photosensitive ceramic.

4. The apparatus of claim 1 further comprising a plurality of conductive vias in the base electrically connecting the contact members to the terminal contacts.

5. The apparatus of claim 1 further comprising a plurality of multi level conductors on the first surface electrically connecting the contact members to the electrical connector.

6. The apparatus of claim 1 wherein the terminal contacts comprise ball contacts in a ball grid array.

7. The apparatus of claim 1 wherein the electrical connector comprises a female electrical connector on the first surface.

8. The apparatus of claim 1 further comprising a force applying mechanism for biasing the wafer against the base comprising a cover on the base and a bladder in contact with the cover and the wafer.

9. An apparatus for testing a semiconductor wafer having a plurality of contact locations comprising:
   a base comprising a first surface for mounting the wafer and an opposing second surface;
   a plurality of contact members on the first surface configured to electrically engage the contact locations;
   a plurality of terminal contacts on the second surface comprising balls in a grid array in electrical communication with the contact members;
   a plurality of conductive vias in the base electrically connecting the contact members to the terminal contacts;
   an electrical edge connector on the base in electrical communication with the contact members; and
   a plurality of conductors on the base electrically connecting the contact members to the electrical connector.

10. The apparatus of claim 9 further comprising a plurality of insulating layers on the base electrically insulating the conductors.

11. The apparatus of claim 9 wherein the contact members comprise indentations in the first surface and conductive layers on the indentations.

12. The apparatus of claim 9 wherein the contact members comprise raised members and conductive layers on the raised members.

13. The apparatus of claim 9 wherein the base comprises a photosensitive ceramic.

14. A method for testing a semiconductor wafer having a plurality of contact locations comprising:
   providing a base having a first surface for mounting the wafer and an opposing second surface, the base comprising:
      a plurality of contact members on the first surface configured to electrically engage the contact locations;
      a plurality of terminal contacts on the second surface in electrical communication with the contact members configured to electrically connect the contact members to a testing circuit;
      an electrical connector on the base in electrical communication with the contact members configured to electrically connect the contact members to the testing circuit;
   testing the wafer by applying first test signals through the terminal contacts to the wafer; and
   burn-in testing the wafer by applying second test signals through the electrical connector to the wafer.

15. The method of claim 14 wherein the contact members comprise metallized indentations.

16. The method of claim 14 wherein the base comprises ceramic.

17. The method of claim 14 wherein the terminal contacts comprise balls in a grid array.

18. The method of claim 14 wherein the electrical connector comprises a female electrical connector on the first surface.

19. A method for testing a semiconductor wafer having a plurality of bumped contact locations comprising:

provoding a base having a first surface for mounting the wafer and an opposing second surface, the base comprising:

a plurality of contact members comprising metallized indentations on the first surface configured to electrically engage the bumped contact locations;

a plurality of terminal contacts on the second surface comprising balls in a grid array in electrical communication with the contact members; and an edge connector in electrical communication with the contact members;

placing the contact members and the bumped contact locations in electrical communication;

applying test signals through the terminal contacts to the wafer; and applying burn-in test signals through the edge connector to the wafer.

20. The method of claim 19 wherein the edge connector comprises a female connector.

* * * * *